United States Patent
Kim et al.

(10) Patent No.: US 9,059,432 B2
(45) Date of Patent: Jun. 16, 2015

(54) ORGANIC LIGHT EMITTING DISPLAY DEVICE AND METHOD FOR FABRICATING THE SAME

(71) Applicant: LG Display Co., Ltd., Seoul (KR)

(72) Inventors: Min-Joo Kim, Seoul (KR); Ho-Young Jeong, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 66 days.

(21) Appl. No.: 13/725,537

(22) Filed: Dec. 21, 2012

(65) Prior Publication Data

US 2013/0207087 A1    Aug. 15, 2013

(30) Foreign Application Priority Data

Feb. 9, 2012    (KR) .................. 10-2012-0013173
Oct. 26, 2012    (KR) .................. 10-2012-0119615

(51) Int. Cl.
| | |
|---|---|
| H01L 29/08 | (2006.01) |
| H01L 51/56 | (2006.01) |
| H01L 27/32 | (2006.01) |
| H01L 29/786 | (2006.01) |
| H01L 27/12 | (2006.01) |
| H01L 51/52 | (2006.01) |

(52) U.S. Cl.
CPC ............ *H01L 51/56* (2013.01); *H01L 27/3225* (2013.01); *H01L 27/3248* (2013.01); *H01L 51/5284* (2013.01); *H01L 27/3262* (2013.01); *H01L 29/78633* (2013.01); *H01L 27/1225* (2013.01)

(58) Field of Classification Search
CPC . H01L 51/56; H01L 27/1225; H01L 51/5203; H01L 27/127; H01L 29/7869
USPC ................ 257/40, 642, E27.117, E51.017, 257/E51.018
See application file for complete search history.

(56) References Cited

U.S. PATENT DOCUMENTS

| | | | | |
|---|---|---|---|---|
| 8,535,975 | B2 * | 9/2013 | Kim et al. | 438/99 |
| 8,723,166 | B2 * | 5/2014 | Park | 257/40 |
| 2007/0002195 | A1 | 1/2007 | Cho | |
| 2007/0064179 | A1 | 3/2007 | Park et al. | |
| 2010/0181563 | A1 * | 7/2010 | Kim et al. | 257/40 |
| 2012/0056184 | A1 * | 3/2012 | Park | 257/59 |

FOREIGN PATENT DOCUMENTS

| | | |
|---|---|---|
| CN | 1561150 A | 1/2005 |
| CN | 101093851 A | 12/2007 |

OTHER PUBLICATIONS

State Intellectual Property Office of the People's Republic of China, First Office Action, Chinese Patent Application No. 201210560786.3, Feb. 17, 2015, thirteen pages.

* cited by examiner

*Primary Examiner* — Andy Huynh
(74) *Attorney, Agent, or Firm* — Fenwick & West LLP

(57) ABSTRACT

An organic light emitting display device includes a light shield layer formed on a substrate and a buffer layer formed on an entire surface of the substrate, an oxide semiconductor layer and first electrode formed on the buffer layer, a gate insulation film and gate electrode formed on the oxide semiconductor layer while being deposited to expose both edges of the oxide semiconductor layer, an interlayer insulation film formed to expose both the exposed edges of the oxide semiconductor layer and the first electrode, source and drain electrodes connected with one edge and the other edge of the oxide semiconductor layer, respectively, and a protective film formed to cover the source and drain electrodes while exposing a region of the first electrode so as to define a luminescent region and a non-luminescent region.

20 Claims, 11 Drawing Sheets

| Work Function [eV] | ITZO | | |
|---|---|---|---|
| | No Surface Treatment | H₂ Plasma | Annealing |
| Experiment 1 | 5.05 | 4.73 | 5.69 |
| Experiment 2 | 5.04 | 4.69 | 5.56 |
| Average | 5.05 | 4.71 | 5.63 |

ORGANIC LIGHT EMITTING DISPLAY DEVICE AND METHOD FOR FABRICATING THE SAME

CROSS-REFERENCE TO RELATED APPLICATIONS

This application claims priority to Republic of Korea Patent Application No. 10-2012-0013173, filed on Feb. 9, 2012, and to Republic of Korea Patent Application No. 10-2012-0119615, filed on Oct. 26, 2012, both of which are incorporated by reference herein in their entirety.

BACKGROUND OF THE INVENTION

1. Field of the Invention

The present invention relates to an organic light emitting display device and a method for fabricating the same capable of simplifying a fabrication process.

2. Discussion of the Related Art

For an image display device which embodies a variety of information on a screen as a core technology in advanced information and communication, there is continuous progress in development of thin, light-weight, and portable devices with improved performance. Hereupon, an Organic Light Emitting Display (OLED) device for controlling a luminescent amount of an organic luminescent layer is recently receiving attention as a flat panel display device, along with need of a flexible display capable of being bent pursuant to convenience and utilization of space.

The OLED device includes a Thin Film Transistor (TFT) array part formed on a substrate, an organic luminescent cell located on the TFT array part, and a glass cap to isolate the organic luminescent cell from the outside. The OLED device applies an electric field to a cathode and anode formed at both ends of an organic luminescent layer so as to inject and transfer electrons and holes into the organic luminescent layer, thereby utilizing an electroluminescence phenomenon which emits light by bonding energy during combination of the electrons and holes. The electrons and holes, which are paired with each other in the organic luminescent layer, emit light while falling from an excited state to a ground state.

In detail, the OLED device includes a plurality of sub-pixels arranged at a pixel region defined by intersection of a gate line and a data line. Each of the sub-pixels receives a data signal from the data line when a gate pulse is supplied to the gate line, thereby generating light corresponding to the data signal. In this case, each sub-pixel includes a TFT formed on the substrate and an organic luminescent cell connected to the TFT.

FIG. 1 is a sectional view illustrating a conventional OLED device. The following description will be given of a method for fabricating the conventional OLED device with reference to FIG. 1.

As shown in FIG. 1, the conventional OLED device includes a TFT formed on a substrate 10, and an organic luminescent cell connected to the TFT while including a first electrode 18, an organic luminescent layer (not shown), and a second electrode (not shown) formed on the organic luminescent layer.

On the substrate 10, a light shield layer 11 is formed using a first mask and a buffer layer 12 is formed to cover the light shield layer 11. An oxide semiconductor layer 13 is formed on the buffer layer 12 using a second mask, and a gate insulation film 14 and gate electrode 14a are deposited in turn on the oxide semiconductor layer 13 using a third mask.

The oxide semiconductor layer 13 is exposed, at both edges thereof, by an interlayer insulation film 15 formed to cover the gate electrode 14a using a fourth mask. Source electrode 16a and drain electrode 16b are formed to be respectively connected to both the exposed edges of the oxide semiconductor layer 13, using a fifth mask. The drain electrode 16b is exposed by a protective film 17 formed on the interlayer insulation film 15 using a sixth mask.

The exposed drain electrode 16b is connected to the first electrode 18 formed on the protective film 17 using a seventh mask, and a bank insulation film 19 is formed on the first electrode 18 using an eighth mask so as to define a luminescent region and non-luminescent region of each sub-pixel. Although not shown, on the exposed first electrode 18, the organic luminescent layer is formed and the second electrode is further formed to cover the organic luminescent layer.

That is, the conventional OLED device as described above is fabricated using eighth masks up to formation of the bank insulation film 19, thereby increasing fabrication costs and process time.

SUMMARY OF THE INVENTION

Accordingly, the present invention provides an organic light emitting display device and a method for fabricating the same capable of simultaneously forming an oxide semiconductor layer and a first electrode and removing a bank insulation film so as to decrease the number of masks, and adjusting a work function of the first electrode, thereby achieving simplification of a fabrication process and a reduction in fabrication costs.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims thereof as well as the appended drawings.

To achieve these objects and other advantages and in accordance with the purpose of the invention, as embodied and broadly described herein, an organic light emitting display device includes a light shield layer formed on a substrate, and a buffer layer formed on an entire surface of the substrate so as to cover the light shield layer, an oxide semiconductor layer and first electrode formed on the buffer layer, a gate insulation film and gate electrode formed on the oxide semiconductor layer while being deposited in turn to expose both edges of the oxide semiconductor layer, an interlayer insulation film formed to expose both the exposed edges of the oxide semiconductor layer and the first electrode, source and drain electrodes connected with one edge and the other edge of the oxide semiconductor layer, which are exposed through the interlayer insulation film, respectively, the drain electrode being connected with the exposed first electrode, and a protective film formed to cover the source and drain electrodes while exposing a partial region of the first electrode so as to define a luminescent region and a non-luminescent region.

The oxide semiconductor layer and the first electrode may be made of a material selected from among indium tin zinc oxide (ITZO), indium gallium zinc oxide (IGZO), and indium aluminum zinc oxide (IAZO).

The oxide semiconductor layer may overlap with the light shield layer while interposing the buffer layer therebetween, and the light shield layer may have a greater width than the oxide semiconductor layer.

Both the edges of the oxide semiconductor layer, which are exposed through the gate insulation film and the gate electrode, may be made of a conductor.

The first electrode exposed through the protective film may have a greater work function than the oxide semiconductor layer.

The organic light emitting display device may further include a reflective layer formed between the substrate and the buffer layer so as to overlap with the first electrode.

In another aspect of the present invention, a method for fabricating an organic light emitting display device includes forming a light shield layer on a substrate using a first mask and forming a buffer layer on an entire surface of the substrate so as to cover the light shield layer, forming an oxide semiconductor layer and a first electrode on the buffer layer using a second mask, forming a gate insulation film and a gate electrode on the oxide semiconductor layer using a third mask while being deposited in turn to expose both edges of the oxide semiconductor layer, forming an interlayer insulation film to expose both the exposed edges of the oxide semiconductor layer and the first electrode using a fourth mask, forming source and drain electrodes connected with one edge and the other edge of the oxide semiconductor layer, which are exposed through the interlayer insulation film, respectively, using a fifth mask, the drain electrode being connected with the exposed first electrode, and forming a protective film to cover the source and drain electrodes using a sixth mask while exposing a partial region of the first electrode so as to define a luminescent region and a non-luminescent region.

A first embodiment of forming the gate insulation film and the gate electrode may include forming a gate insulation material and a gate electrode material in turn on the substrate formed with the oxide semiconductor layer and the first electrode, forming a photoresist pattern having first and second heights different from each other on the gate electrode material, patterning the gate electrode material and the gate insulation material by an etching process using the photoresist pattern as a mask so as to form the gate insulation film and the gate electrode on each of the oxide semiconductor layer and the first electrode, treating both edges of the oxide semiconductor layer, which are exposed by the photoresist pattern, with at least one plasma of helium (He), hydrogen ($H_2$), and nitrogen ($N_2$), ashing the photoresist pattern so that the photoresist pattern having the first height is removed and the photoresist pattern having the second height is reduced in height, removing the gate electrode and the gate insulation film on the first electrode, which are exposed by the removed photoresist pattern having the first height, so as to expose the first electrode, and removing the photoresist pattern over the oxide semiconductor layer.

A second embodiment of forming the gate insulation film and the gate electrode may include forming a gate insulation material and a gate electrode material in turn on the substrate formed with the oxide semiconductor layer and the first electrode, forming a photoresist pattern on the gate electrode material, patterning the gate electrode material and the gate insulation material by an etching process using the photoresist pattern as a mask so as to form the gate insulation film and the gate electrode on the oxide semiconductor layer, treating both edges of the oxide semiconductor layer, which are exposed by the photoresist pattern, with at least one plasma of He, $H_2$, and $N_2$, and removing the photoresist pattern over the oxide semiconductor layer.

After the forming the protective film, the first electrode may have a greater work function than the oxide semiconductor layer by annealing of the first electrode for 30 minutes to 2 hours at a temperature of 200° C. to 300° C.

The oxide semiconductor layer may overlap with the light shield layer with the buffer layer interposed therebetween, and the light shield layer may have a greater width than the oxide semiconductor layer.

The method for fabricating the organic light emitting display device may further include forming a reflective layer between the substrate and the buffer layer so as to overlap with the first electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to an organic light emitting display device and a method for fabricating the same according to an exemplary embodiment of the present invention, examples of which are illustrated in the accompanying drawings. Wherever possible, the same reference numbers will be used throughout the drawings to refer to the same or like parts.

Figure 1:
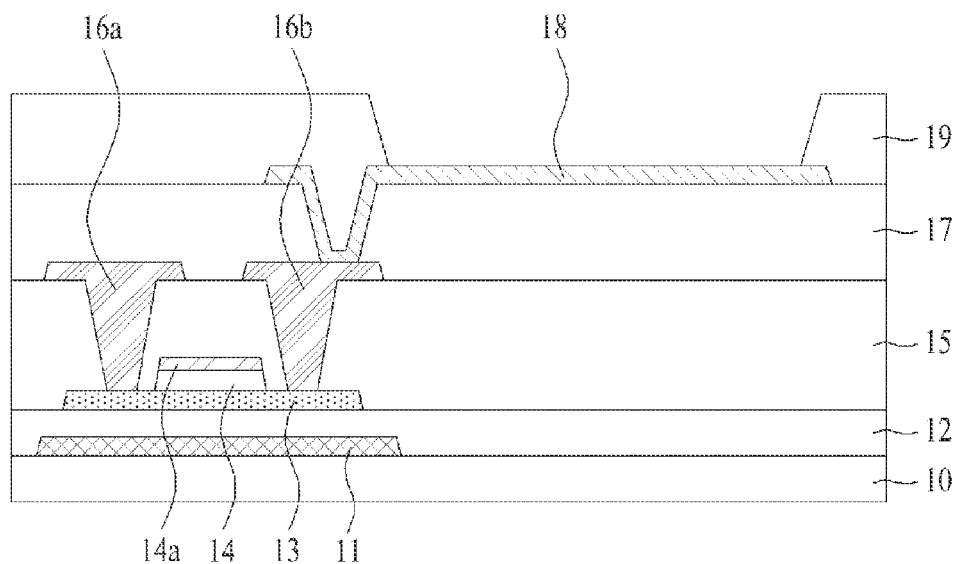
FIG. 1 is a sectional view illustrating a conventional OLED device.
Figure 2:
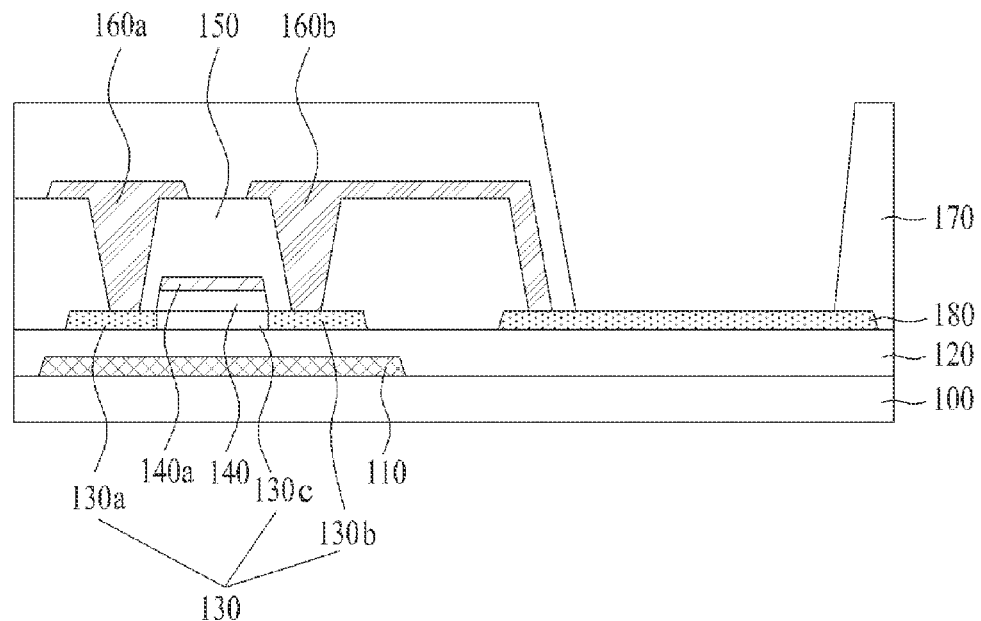
FIG. 2 is a sectional view illustrating an OLED device according to an embodiment of the present invention.
Figure 3:
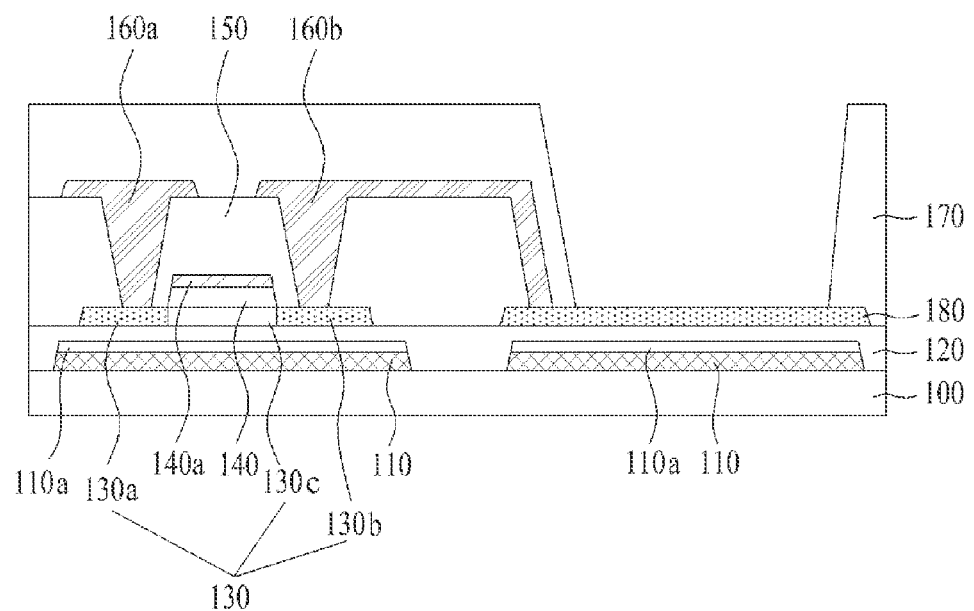
FIG. 3 is a sectional view illustrating a case in which the OLED device of FIG. 2 is a top emission type OLED device according to an embodiment.

FIG. 2 is a sectional view illustrating an Organic Light Emitting Display (OLED) device according to an embodiment of the present invention. FIG. 3 is a sectional view illustrating a case in which the OLED device of FIG. 2 is a top emission type OLED device according to an embodiment.

As shown in FIG. 2, a light shield layer 110 is formed on a substrate 100. The light shield layer 110 serves to absorb light and to prevent external light from being incident upon an oxide semiconductor layer to be described later. The light shield layer 110 is made of a metal material such as molybdenum (Mo) or made of a black organic material. The substrate 100 is formed, at an entire surface thereof, with a buffer layer 120 to cover the light shield layer 110.

An oxide semiconductor layer 130 and a first electrode 180 are formed on the buffer layer 120, and the oxide semiconductor layer 130 and the first electrode 180 are made of an oxide such as indium gallium zinc oxide (IGZO), indium tin zinc oxide (ITZO), or indium aluminum zinc oxide (IAZO). In this case, the oxide semiconductor layer 130 is formed to overlap with the light shield layer 110, and thus external light may be prevented from being incident upon the oxide semiconductor layer 130. Furthermore, the light shield layer 110 may have a greater width than the oxide semiconductor layer 130 so as to completely block incidence of external light upon the oxide semiconductor layer 130. The oxide semiconductor layer 130 includes a source region 130*a* connected to a source electrode 160*a*, a drain region 130*b* connected to a drain electrode 160*b*, and a channel region 130*c* overlapping with a gate electrode 140*a* with a gate insulation film 140 interposed therebetween.

In order to expose the source region 130*a* and the drain region 130*b* which are located at both edges of the oxide semiconductor layer 130, the gate insulation film 140 and the gate electrode 140*a* are formed to be deposited in turn on the oxide semiconductor layer 130. Particularly, both the exposed edges of the oxide semiconductor layer 130 are made of a conductor by plasma treatment. Accordingly, when the edges of the oxide semiconductor layer 130 are connected to the respective source and drain electrodes to be described later, resistance of the oxide semiconductor layer 130 is decreased to improve contact characteristics.

An interlayer insulation film 150 is formed to expose a partial region of the first electrode 180 on the gate electrode 140*a*. The interlayer insulation film 150 exposes both the plasma-treated edges of the oxide semiconductor layer 130, and both the exposed edges of the oxide semiconductor layer 130 are connected to the source and drain electrodes 160*a* and 160*b*, respectively. The drain electrode 160*b* also extends onto the exposed first electrode 180, thereby being directly connected to the first electrode 180.

As described above, the oxide semiconductor layer 130, the gate insulation film 140, the gate electrode 140*a*, and the source and drain electrodes 160*a* and 160*b* are included in an oxide Thin Film Transistor (TFT) having advantages such as higher mobility and lower leakage current characteristics, compared with a silicon TFT. Furthermore, the TFT, using a crystallization process, such as the silicon TFT has poor uniformity during the crystallization process such as becoming a large area, thereby being unfavorable to the large area. On the other hand, the oxide TFT has an advantage to be formed in the large area.

A protective film 170 is formed to cover the source and drain electrodes 160*a* and 160*b*. In this case, the protective film 170 exposes a partial region of the first electrode 180 so as to define a luminescent region and non-luminescent region of a sub-pixel. Accordingly, since the protective film 170 functions as a bank insulation film, the OLED device according to the illustrated embodiment of the present invention may remove a process of forming the bank insulation film. In addition, a work function is adjusted through annealing of the exposed first electrode 180.

The conventional OLED device has a great difference between a work function of a first electrode and a Highest Occupied Molecular Orbital (HOMO) level of an organic luminescent layer when holes are injected from the first electrode to the organic luminescent layer. Consequently, no holes may be smoothly injected into the organic luminescent layer. Accordingly, the conventional OLED device should further form functional layers such as a hole injection layer and a hole transport layer between the first electrode and the organic luminescent layer, thereby causing increase of fabrication costs and complicating processes.

On the other hand, the OLED device according to the illustrated embodiment of the present invention performs annealing of the first electrode 180. By annealing the first electrode 180, the first electrode 180 has a greater work function than the oxide semiconductor layer 130. That is, the work function of the first electrode 180 is increased through annealing, thereby decreasing the difference between the work function of the first electrode 180 and a HOMO level of an organic luminescent layer. Hence, even when the hole injection layer and hole transport layer are removed, the holes may be smoothly injected into the organic luminescent layer.

Although not shown in FIGS. 2 and 3, on the exposed first electrode 180, an organic luminescent layer is formed and a second electrode made of a material such as aluminum (Al) or silver (Ag) is formed to cover the organic luminescent layer. In particular, when the OLED device according to the illustrated embodiment of the present invention is a bottom emission type OLED device, light generated from the organic luminescent layer is reflected at the second electrode by adjusting a thickness of the second electrode so as to progress toward the first electrode 180.

Meanwhile, when the OLED device according to the illustrated embodiment of the present invention is a top emission type OLED device, a reflective layer 110*a* is further formed between the substrate 100 and the buffer layer 120 so as to overlap with the first electrode 180, as shown in FIG. 3. The reflective layer 110*a* is made of a material such as aluminum neodymium (AlNd). Consequently, light, which is generated from the organic luminescent layer (not shown) and progresses toward the first electrode 180, is reflected at the reflective layer 110*a* so as to progress toward the second electrode (not shown). Particularly, the top emission type OLED device may include a second electrode having a thinner thickness than the second electrode of a bottom emission type OLED device, in order to emit light through the second electrode to the outside.

Although shown as being also formed on the light shield layer 110 overlapping with the TFT in the drawing, the reflective layer 110*a* may alternatively be formed to overlap with only the first electrode 180 or may be formed to overlap with the first electrode 180 and the oxide semiconductor layer 130 of the TFT without the light shield layer.

Hereinafter, the following description will be given of a method for fabricating the OLED device according to the illustrated embodiment of the present invention with reference to the accompanying drawings in detail.

Figure 4:
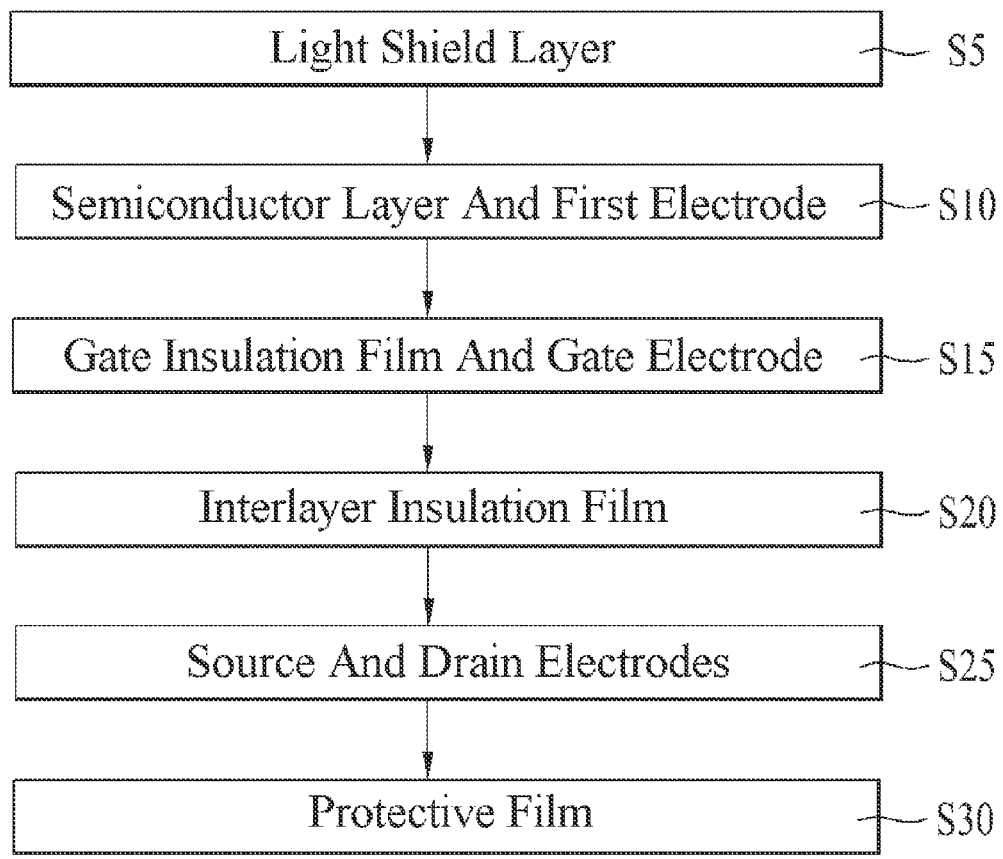
FIG. 4 is a flowchart illustrating process steps for fabricating the OLED device according to the illustrated embodiment of the present invention.

FIG. 4 is a flowchart illustrating process steps of fabricating the OLED device according to the illustrated embodiment of the present invention. FIGS. 5A to 5F are sectional views illustrating a process of fabricating the OLED device according to the illustrated embodiment of the present invention.

Figure 5A:
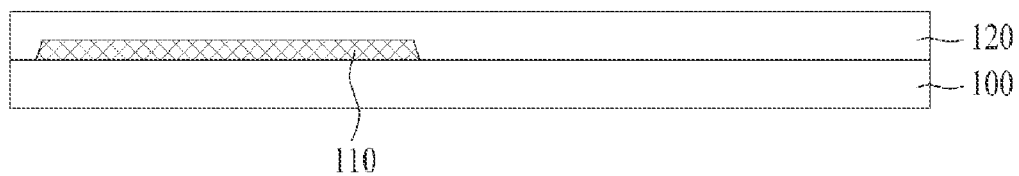
FIGS. 5A to 5F are sectional views illustrating a process of fabricating the OLED device according to the illustrated embodiment of the present invention.

As shown in FIGS. 4 and 5A, the light shield layer 110 is formed on the substrate 100 using a first mask (S5). The light shield layer 110 serves to prevent external light from being incident upon the oxide semiconductor layer 130. Then, the buffer layer 120 is formed on the surface of the substrate 100 so as to cover the light shield layer 110.

Particularly, when the OLED device according to the illustrated embodiment of the present invention is a top emission type OLED device as shown in FIG. 3, a light shield material and a reflective material are deposited in turn on the substrate 100 and are then simultaneously etched using the first mask. Accordingly, the light shield layer 110 and the reflective layer 110a are deposited in turn at regions overlapping with the TFT and the first electrode 180, so that the light progressing toward the first electrode 180, among light emitted from the organic luminescent layer, is reflected through the reflective layer 110a and progresses upwards.

Meanwhile, the light shield layer 110 may be formed at a region overlapping with the TFT using a half tone mask as the first mask, and the light shield layer 110 and the reflective layer 110a having a lamination structure in this order may also be formed at a region overlapping with the first electrode 180. In addition, the light shield layer 110 may be formed on the substrate 100 overlapping with the TFT, and the reflective layer 110a may also be formed on the substrate 100 overlapping with the first electrode 180. Since this, however, should form the light shield layer 110 and the reflective layer 110a using different mask processes, respectively, a mask process is added.

Figure 5B:
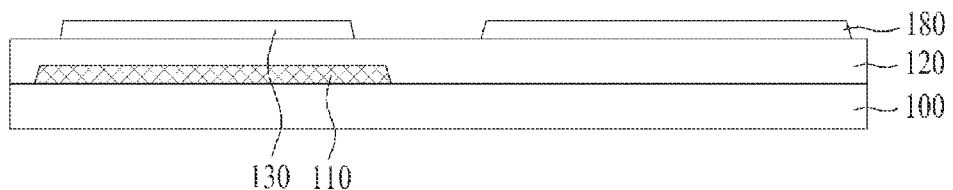

Thereafter, the oxide semiconductor layer 130 and the first electrode 180 are formed on the buffer layer 120 using a second mask (S10), as shown in FIG. 5B. That is, the oxide semiconductor layer 130 and the first electrode 180 are simultaneously formed, thereby enabling removal of a separate process for formation of the first electrode 180. In this case, the oxide semiconductor layer 130 and the first electrode 180 are made of a material such as IGZO, ITZO, or IAZO.

Figure 5C:
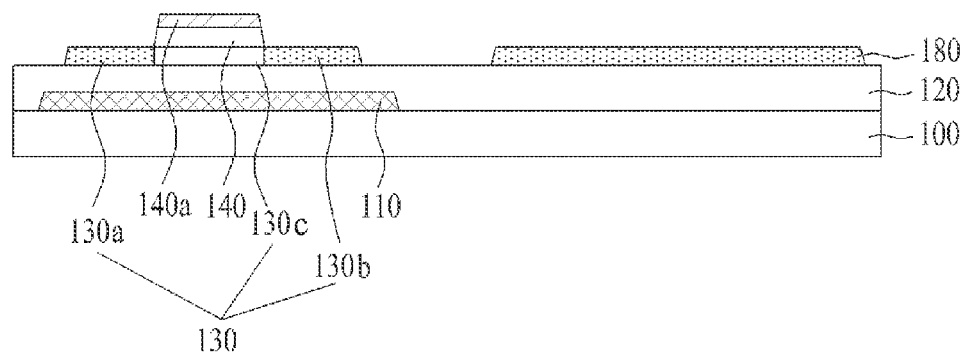

Subsequently, the gate insulation film 140 and the gate electrode 140a are formed in turn on the oxide semiconductor layer 130 using a third mask (S15), as shown in FIG. 5C.

Specifically, a gate insulation material and a gate electrode material are deposited in turn on an entire surface of the buffer layer 120, which includes the oxide semiconductor layer 130. Then, the gate insulation material and the gate electrode material are patterned so as to form the gate insulation film 140 and the gate electrode 140a for exposing both edges of the oxide semiconductor layer 130.

In this case, the exposed both edges of the oxide semiconductor layer 130 are made of the conductor by plasma such as helium (He), hydrogen ($H_2$), or nitrogen ($N_2$) to form the source and drain regions 130a and 130b. Resistance of the oxide semiconductor layer 130 is decreased when the source and drain regions 130a and 130b of the oxide semiconductor layer 130 are respectively connected to the source and drain electrodes 160a and 160b, thereby improving contact characteristics. Specifically, the plasma treatment process and the third mask process to pattern the gate insulation film 140 and the gate electrode 140a will be described later with reference to FIGS. 6A to 6E and 7A to 7D.

Figure 5D:
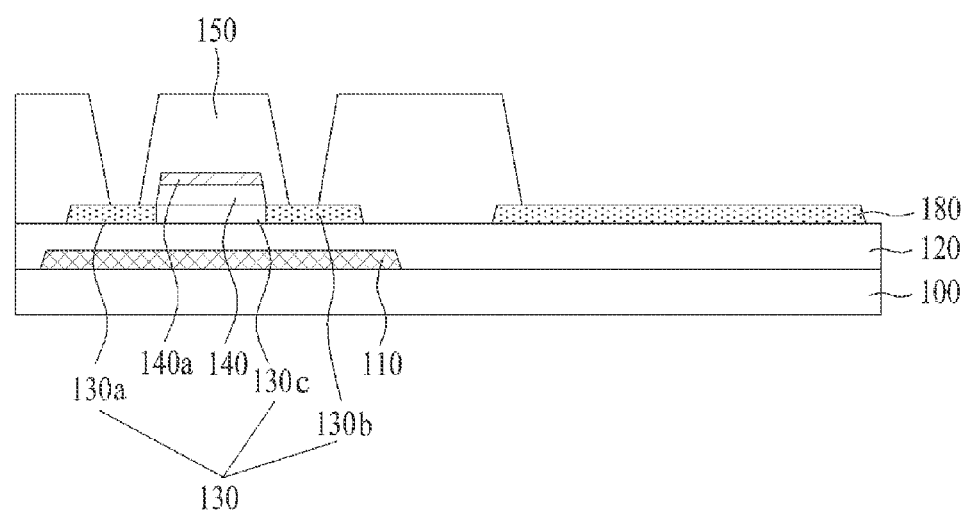

Subsequently, the interlayer insulation film 150 is formed on the gate electrode 140a using a fourth mask so as to expose a partial region of the first electrode 180 (S20), as shown in FIG. 5D. In this case, the interlayer insulation film 150 exposes the plasma-treated edges of the oxide semiconductor layer 130.

Figure 5E:
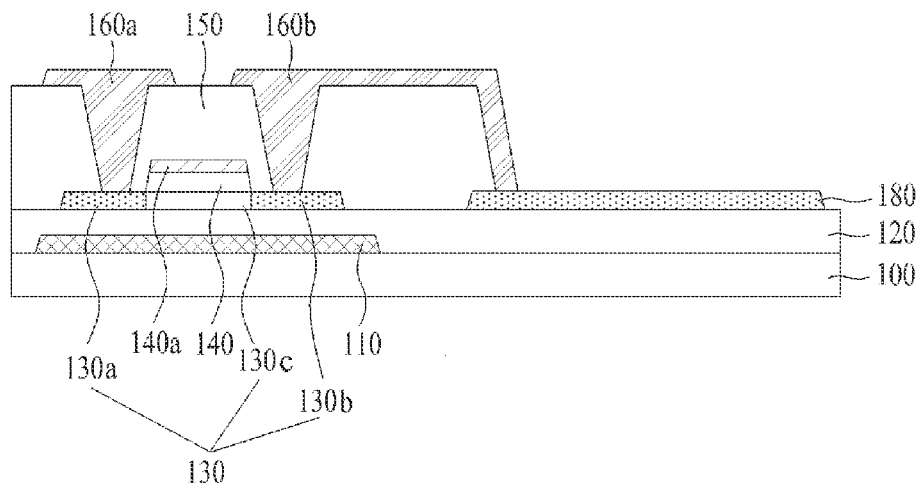

As shown in FIG. 5E, the source electrode 160a is formed to be connected with one exposed edge of the oxide semiconductor layer 130 and the drain electrode 160b is formed to be connected with another exposed edge thereof, using a fifth mask (S25). In this case, the drain electrode 160b extends up to the exposed first electrode 180, thereby being directly connected to the first electrode 180.

Figure 5F:
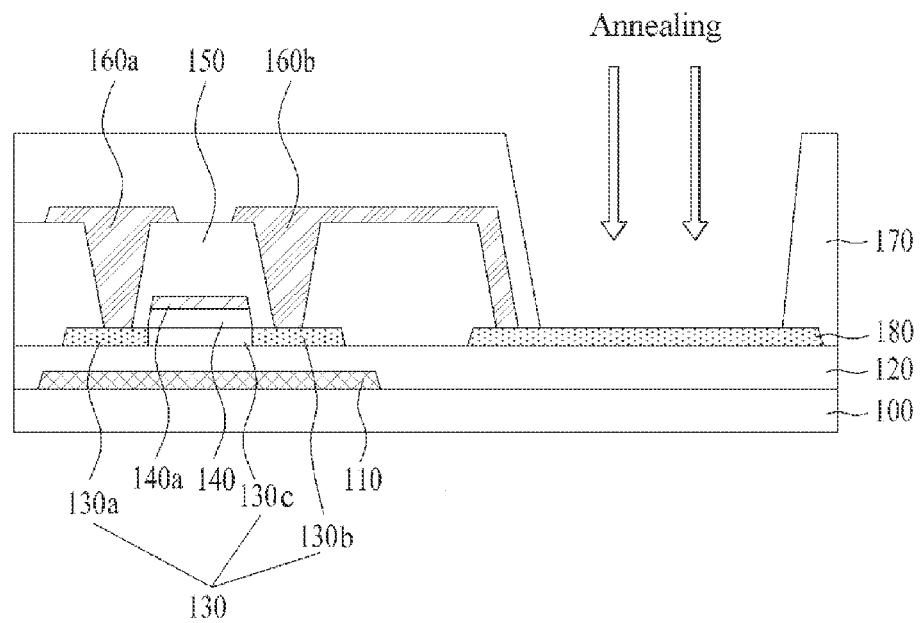

Subsequently, the protective film 170 is formed to cover the source and drain electrodes 160a and 160b using a sixth mask (S30), as shown in FIG. 5F. In this case, the protective film 170 exposes a partial region of the first electrode 180 so as to define the luminescent region and the non-luminescent region, thereby functioning as the bank insulation film. Accordingly, it may be possible to remove the process of forming the bank insulation film.

In addition, the first electrode 180 has a greater work function than the oxide semiconductor layer 130 by annealing of the exposed first electrode 180, thereby enabling a decrease of the difference between the work function of the first electrode 180 and the HOMO level of the organic luminescent layer. In one embodiment, the annealing is executed for 30 minutes to 2 hours at a temperature of 200 to 300° C.

Meanwhile, the gate insulation film 140, interlayer insulation film 150, and protective film 170 formed on the oxide semiconductor layer 130 may prevent heat from being transferred to the oxide semiconductor layer 130, during an annealing process. As a result, it may be possible to prevent variations of the work function and sheet resistance in the oxide semiconductor layer 130.

A conventional OLED device further forms the functional layers such as the hole injection layer and the hole transport layer between the first electrode 180 and the organic luminescent layer so as to smoothly inject holes from the first electrode 180 which is an anode. The OLED device according to the illustrated embodiment of the present invention may increase the work function of the first electrode 180 through annealing thereof, thereby enabling removal of the functional layers between the first electrode 180 and the organic luminescent layer. Accordingly, holes may be smoothly injected into the organic luminescent layer by formation of the organic luminescent layer directly on the first electrode 180, thereby achieving an improvement in luminous efficiency. Thus, it is possible to accomplish simplification of a fabrication process and a reduction in fabrication costs by removal of the above-mentioned functional layers.

FIGS. 6A to 6E are sectional views for specifically explaining a first embodiment of the plasma treatment process and the third mask process illustrated in FIG. 5C.

Figure 6A:
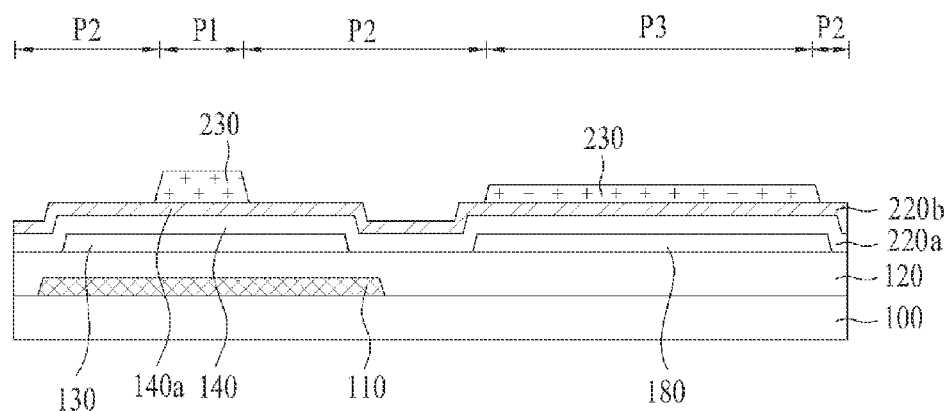
FIGS. 6A to 6E are sectional views for illustrating a first embodiment of the plasma treatment process and the third mask process illustrated in FIG. 5C.

As shown in FIG. 6A, a gate insulation material 220a and a gate electrode material 220b are deposited in turn on the surface of the substrate 100 formed with the oxide semiconductor layer 130. Then, a photoresist pattern 230 is formed on the gate electrode material 220b through a photolithographic process using a photo mask (not shown) such as a half tone mask and a slit mask. The photoresist pattern 230 having a first height is formed at a semi-transmission region P3 of the photo mask, whereas the photoresist pattern 230 having a greater second height than the first height is formed at a cut-off region P1 of the photo mask. Also, a transmission region P2 of the photo mask is formed to expose the gate electrode material 220b.

Figure 6B:
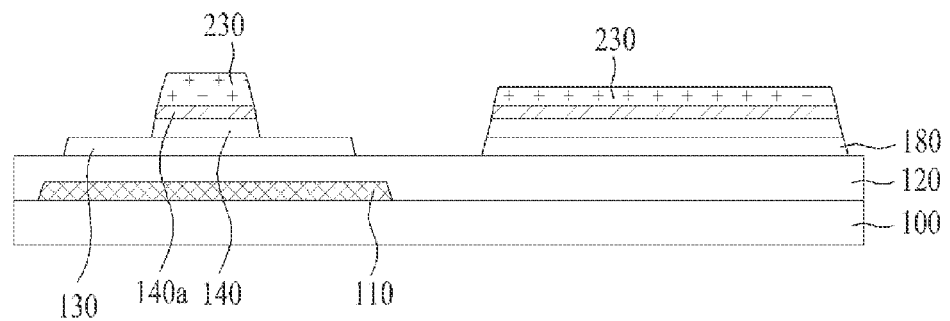

Through an etching process using the photoresist pattern 230 as a mask, the gate insulation and gate electrode materials 220a and 220b are etched to form the gate insulation film 140 and gate electrode 140a having the same pattern, as shown in FIG. 6B. In this case, the gate insulation film 140 and gate electrode 140a on the oxide semiconductor layer 130 are formed to expose both edges of the oxide semiconductor layer 130. On the other hand, the gate insulation film 140 and gate electrode 140a on the first electrode 180 are formed to enclose the first electrode 180 in the form of a pattern equal to or wider than the first electrode 180, thereby protecting the first electrode 180.

Figure 6C:
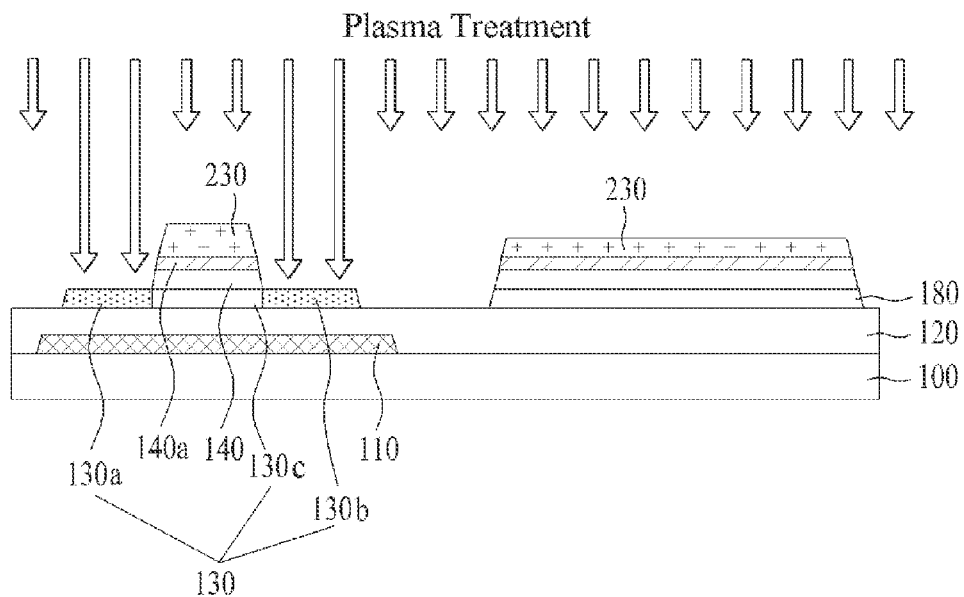

Thereafter, both the exposed edges of the oxide semiconductor layer 130 are treated with plasma such as He, $H_2$, or $N_2$, using the photoresist pattern 230 as a mask, as shown in FIG. 6C. Accordingly, only both edges of the oxide semiconductor layer 130 are selectively made of the conductor so as to form the source and drain regions 130a and 130b of the oxide semiconductor layer 130 and the channel region 130c maintaining a semiconductor state between the source region 130a and the drain region 130b.

Figure 6D:
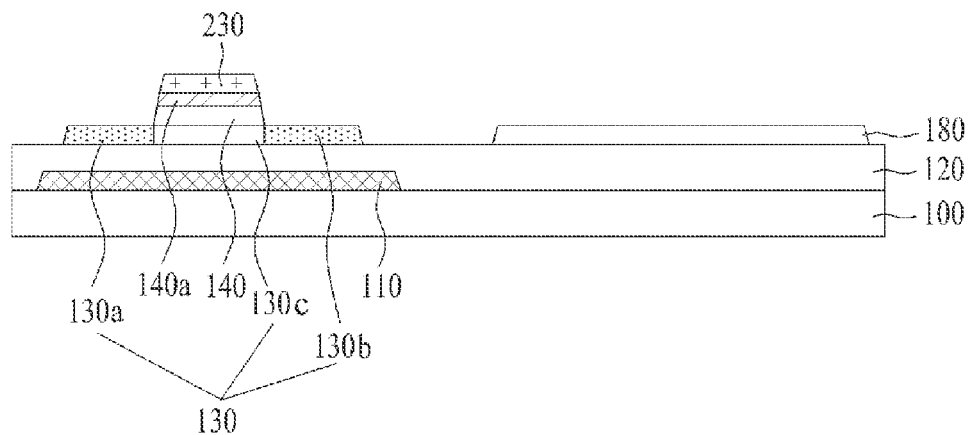

Then, by an ashing process using oxygen ($O_2$) plasma, a thickness of the photoresist pattern 230 having the second height becomes thin, and the photoresist pattern 230 having the first height is removed, as shown in FIG. 6D. Consequently, the gate insulation film 140 and gate electrode 140a on the first electrode 180 are exposed. The exposed gate insulation film 140 and gate electrode 140a on the first electrode 180 are removed through an etching process using the ashed photoresist pattern 230 as a mask.

Figure 6E:
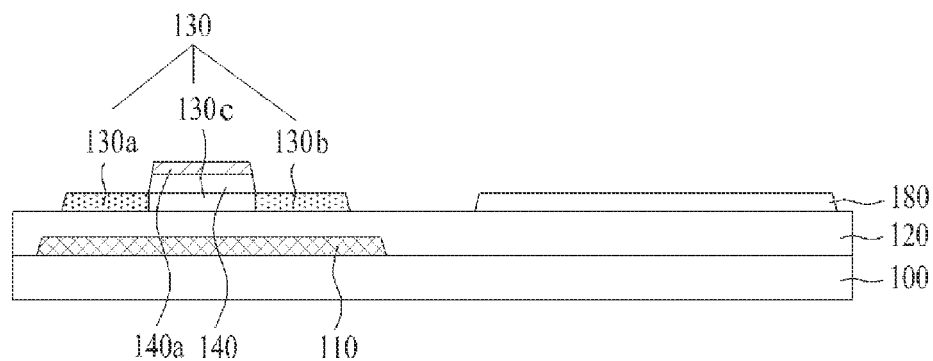

Subsequently, the photoresist pattern 230 remaining over the channel region 130c of the oxide semiconductor layer is removed through a strip process, as shown in FIG. 6E.

FIGS. 7A to 7D are sectional views for specifically explaining a second embodiment of the plasma treatment process and the third mask process illustrated in FIG. 5C.

Figure 7A:
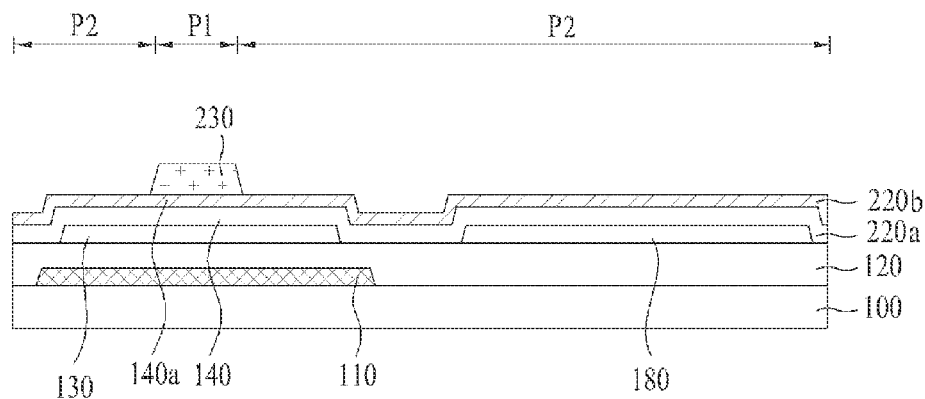
FIGS. 7A to 7D are sectional views for specifically explaining a second embodiment of the plasma treatment process and the third mask process illustrated in FIG. 5C.

As shown in FIG. 7A, a gate insulation material 220a and a gate electrode material 220b are deposited in turn on the entire surface of the substrate 100 formed with the oxide semiconductor layer 130. Then, a photoresist pattern 230 is formed on the gate electrode material 220b through a photolithographic process using a photo mask (not shown). The photoresist pattern 230 is formed at a cut-off region P1 of the photo mask, and a transmission region P2 of the photo mask is formed to expose the gate electrode material 220b.

Figure 7B:
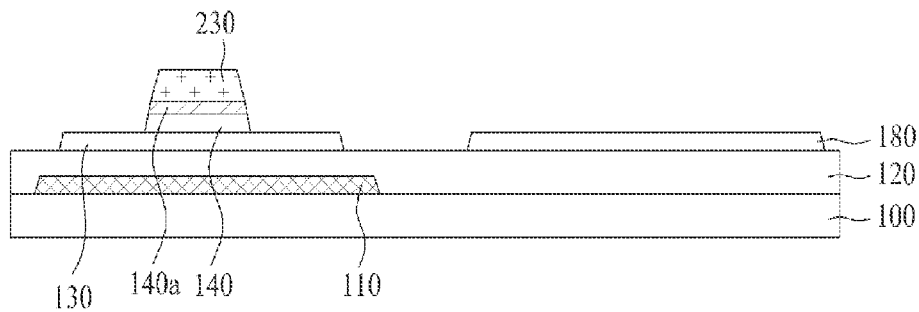

The gate insulation and gate electrode materials 220a and 220b are etched through an etching process using the photoresist pattern 230 as a mask, as shown in FIG. 7B. Consequently, the gate insulation film 140 and gate electrode 140a having the same pattern are formed on the oxide semiconductor layer 130, and the gate insulation and gate electrode materials 220a and 220b on the first electrode 180 are removed to expose the first electrode 180. In this case, the gate insulation film 140 and gate electrode 140a on the oxide semiconductor layer 130 are formed to expose both edges of the oxide semiconductor layer 130.

Figure 7C:
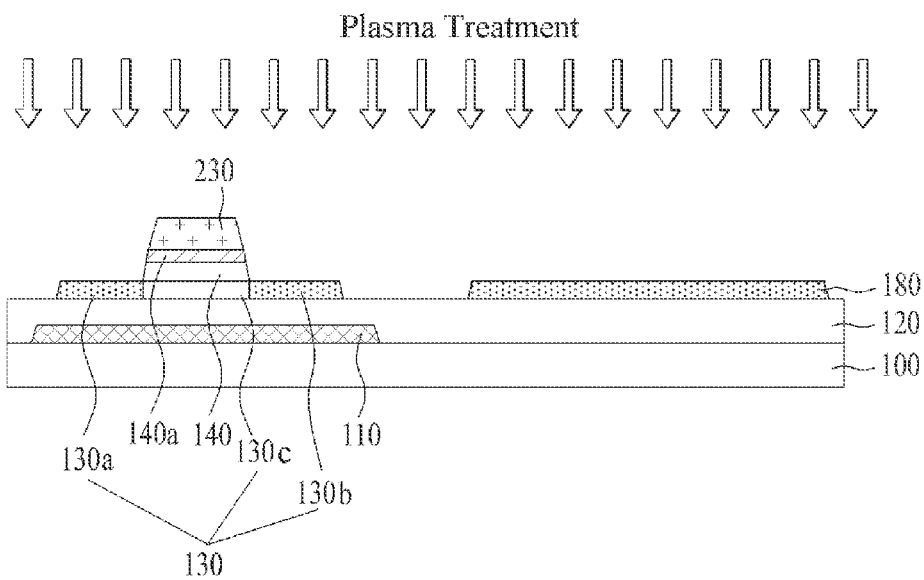

Thereafter, both the exposed edges of the oxide semiconductor layer 130 are treated with at least one plasma of He, $H_2$, and $N_2$, using the photoresist pattern 230 as a mask, as shown in FIG. 7C. Accordingly, both edges of the oxide semiconductor layer 130 are made of the conductor so as to form the source and drain regions 130a and 130b of the oxide semiconductor layer and the channel region 130c maintaining a semiconductor state between the source region 130a and the drain region 130b. Meanwhile, the exposed first electrode 180 is also treated with plasma during plasma treatment of both edges of the oxide semiconductor layer 130. In this case, the plasma-treated first electrode 180 has the desired sheet resistance and work function through the annealing process, as shown in FIG. 5F.

Figures 7D, 8:
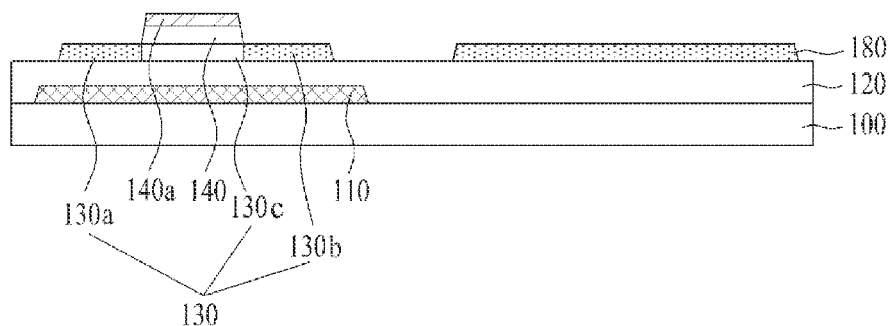
FIG. 8 is a table illustrating variation in a work function according to a surface treatment method of ITZO according to an embodiment.

Subsequently, the photoresist pattern 230 remaining over the channel region 130c of the oxide semiconductor layer is removed through a strip process, as shown in FIG. 7D.

Meanwhile, the source and drain regions 130a and 130b of the oxide semiconductor layer have been illustrated, for example, as formed by the plasma treatment using the photoresist pattern, which is formed through the photolithographic process using the photo mask, as the mask. However, the source and drain regions 130a and 130b may be formed by ultraviolet (UV) irradiation on only the oxide semiconductor layer using the gate electrode 140a as a mask without the photo mask.

Also, when the gate electrode 140a and the gate insulation film 140 are patterned by a dry etching process using plasma, both edges of the oxide semiconductor layer 130 may be made of the conductor by the plasma used during the dry etching process. Consequently, the source and drain regions 130a and 130b may also be formed.

Figure 9A:
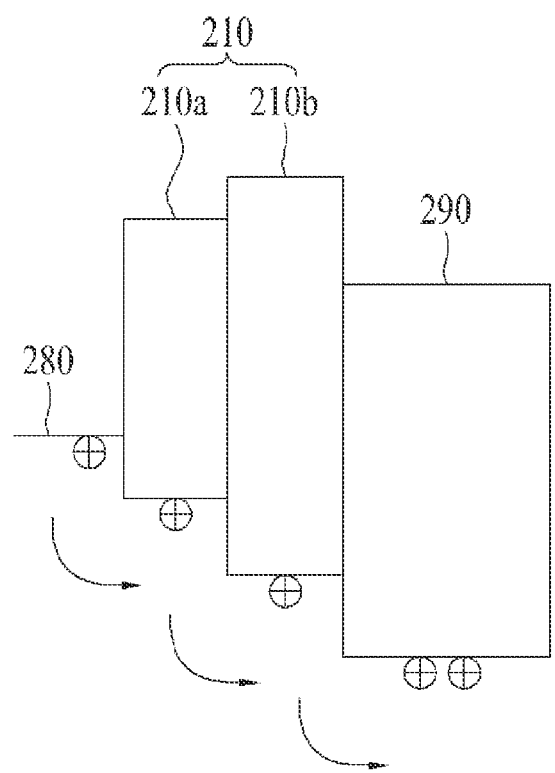
FIG. 9A is a sectional view illustrating an energy level of the OLED device before annealing according to an embodiment.
Figure 9B:
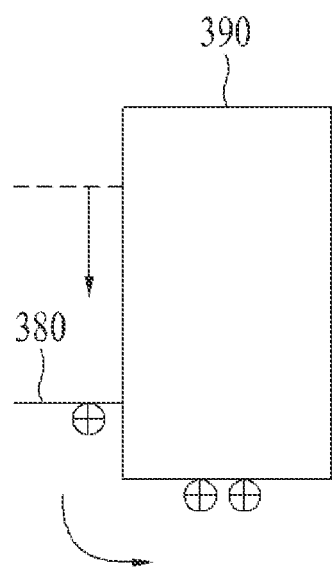
FIG. 9B is a sectional view illustrating the energy level of the OLED device after annealing according to an embodiment.

FIG. 8 is a table illustrating variation in a work function according to a surface treatment method of ITZO. FIG. 9A is a sectional view illustrating an energy level of the OLED device before annealing, wherein only the first electrode, functional layer, and organic luminescent layer are illustrated. FIG. 9B is a sectional view illustrating the energy level of the OLED device after annealing, wherein only the first electrode and organic luminescent layer are illustrated.

As shown in FIG. 8, a work function of ITZO may be adjusted by $H_2$ plasma treatment or annealing. First, when no treatment is performed for ITZO, the ITZO has the work function of 5.05 eV. In this case, it is difficult for holes to be smoothly injected into an organic luminescent layer 290 having a HOMO level of about 5.9 to 6.0 eV, as shown in FIG. 9A. Therefore, functional layers 210 such as a hole injection layer 210a and a hole transport layer 210b should be formed between a first electrode 280 and the organic luminescent layer 290. That is, since a difference between the work function of the first electrode 280 and the HOMO level of the organic luminescent layer 290 is great, the holes are gradationally injected from the first electrode 280 to the organic luminescent layer 290 through the functional layers 210.

In the case of executing annealing of ITZO for one hour at a temperature of 230° C., the ITZO has the increased work function of 5.63 eV. That is, even when the functional layers such as the hole injection layer and the hole transport layer 210b are not formed between a first electrode 380 and the organic luminescent layer 390, the holes are smoothly injected from the first electrode 380 to the organic luminescent layer 390, as shown in FIG. 9B.

Also, when ITZO is $H_2$ plasma-treated for 60 seconds under a pressure of 100 mTorr and an electric power of 500 W by injection of $H_2$ at 100 sccm, the ITZO has the decreased work function of 4.71 eV, thereby being made of the conductor, as opposed to the case of annealing.

That is, oxides including indium zinc oxide (IZO) such as indium tin zinc oxide (ITZO), indium gallium zinc oxide (IGZO), or indium aluminum zinc oxide (IAZO) may adjust the work function through $H_2$ plasma treatment or annealing. Accordingly, the OLED device, having the oxide TFT, according to the illustrated embodiment of the present invention executes annealing of the first electrode 180 made of the same material as the oxide semiconductor layer 130, thereby enabling increase of the work function of the first electrode 180. Hence, it may be possible to achieve simplification of a fabrication process and a reduction in fabrication costs by removal of the functional layers between the first electrode 180 and the organic luminescent layer.

Accordingly, in accordance with the organic light emitting display device and the method for fabricating the same according to the illustrated embodiment of the present invention, the oxide semiconductor layer and the first electrode are simultaneously formed, thereby enabling a decrease of one mask in the number of masks to form the first electrode. In addition, the protective film 170 formed on the source and drain electrodes functions as the bank insulation film defining the luminescent region and the non-luminescent region, thereby enabling a decrease of one mask in the number of masks to form the bank insulation film. Thus, the organic light emitting display device according to the illustrated embodiment of the present invention may decrease a total of two masks, compared with the conventional device. As a result, it may be possible to achieve simplification of a fabrication process and a reduction in fabrication costs.

As is apparent from the above description, an organic light emitting display device and a method for fabricating the same according to the present invention has the following effects.

First, an oxide semiconductor layer and a first electrode are simultaneously formed, thereby enabling a decrease of one mask in the number of masks to form the first electrode. Particularly, a work function of the first electrode may be adjusted by annealing the first electrode. Accordingly, even when functional layers between the first electrode and an organic luminescent layer are removed, holes are smoothly injected from the first electrode to the organic luminescent layer. Consequently, it may be possible to improve luminous efficiency of the organic light emitting display device and at the same time to achieve simplification of a fabrication process and a reduction in fabrication costs.

Second, a protective film formed on source and drain electrodes functions as a bank insulation film defining a luminescent region and non-luminescent region of a sub-pixel, thereby enabling a decrease of one mask in the number of masks to form the bank insulation film.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
a substrate
a light shield layer formed on the substrate;
a buffer layer formed on a surface of the substrate so as to cover the light shield layer;
an oxide semiconductor layer formed on the buffer layer, the oxide semiconductor layer having a source area, a drain area, and a channel area between the source area and the drain area;
a first electrode formed on the buffer layer;
a reflective layer formed between the substrate and the buffer layer so as to overlap with the first electrode;
a gate insulation film formed on the channel area of the oxide semiconductor layer;
a gate electrode formed on the gate insulation film;
an interlayer insulation film covering the gate insulation film and the gate electrode;
a source electrode connected to the source area of the oxide semiconductor layer;
a drain electrode connected to the drain area of the oxide semiconductor layer and further connected to the first electrode; and
a protective film formed to cover the source electrode and the drain electrode and exposing a region of the first electrode.

2. The organic light emitting display device according to claim 1, wherein the oxide semiconductor layer overlaps with the light shield layer, and wherein the light shield layer has a greater width than the oxide semiconductor layer.

3. The organic light emitting display device according to claim 1, wherein the exposed region of the first electrode has a greater work function than the oxide semiconductor layer.

4. A method for fabricating an organic light emitting display device, the method comprising:
preparing a substrate;
forming a light shield layer on the substrate;
forming a buffer layer on a surface of the substrate so as to cover the light shield layer;
forming a reflective layer between the substrate and the buffer layer;
forming an oxide semiconductor layer on the buffer layer so as to have a source area, a drain area, and a channel area between the source area and the drain area;
forming a first electrode on the buffer layer, the reflective layer overlapping with the first electrode;
forming a gate insulation film on the channel area of the oxide semiconductor layer;
forming a gate electrode on the gate insulation film;
forming an interlayer insulation film covering the gate insulation film and the gate electrode;
forming a source electrode connected to the source area of the oxide semiconductor layer;
forming a drain electrode connected to the drain area of the oxide semiconductor layer and further connected to the first electrode; and
forming a protective film to cover the source electrode and the drain electrode and expose a region of the first electrode.

5. The method according to claim 4, wherein forming the gate insulation film and forming the gate electrode comprises:
forming a gate insulation material and a gate electrode material sequentially on the surface of the substrate;
forming a photoresist pattern including a first photoresist pattern on the channel area and a second photoresist pattern on the first electrode, wherein the first photoresist pattern has a greater height than the second photoresist pattern;
patterning the gate electrode material and the gate insulation material by an etching process using the photoresist pattern as a mask so as to form the gate insulation film and the gate electrode on the channel area and the first electrode and expose the source area and the drain area;
treating the source area and the drain area with at least one helium (He) plasma, hydrogen ($H_2$) plasma, and nitrogen ($N_2$) plasma;
ashing the photoresist pattern so that the first photoresist pattern is reduced in height and the second photoresist pattern is removed;
removing the gate electrode and the gate insulation film on the first electrode so as to expose the first electrode; and
removing the photoresist pattern on the channel area.

6. The method according to claim 4, wherein forming the gate insulation film and forming the gate electrode comprises:
forming a gate insulation material and a gate electrode material sequentially on the surface of the substrate;
forming a photoresist pattern on the channel area;
patterning the gate electrode material and the gate insulation material by an etching process using the photoresist pattern as a mask so as to form the gate insulation film and the gate electrode on the channel area and expose the source area, the drain area and the first electrode;
treating the source area, the drain area and the first electrode with at least one of He plasma, $H_2$ plasma, and $N_2$ plasma; and
removing the photoresist pattern on the channel area.

7. The method according to claim 4, further comprising:
after forming the protective film, annealing the first electrode for a time period between 30 minutes and 2 hours at a temperature between 200° C. and 300° C., the annealing causing the first electrode to have a greater work function than the oxide semiconductor layer.

8. The method according to claim 4, wherein the oxide semiconductor layer overlaps with the light shield layer with the buffer layer interposed therebetween, and wherein the light shield layer has a greater width than the oxide semiconductor layer.

9. An organic light emitting diode display device, comprising:
a substrate defining a plurality of pixels having a luminescent region and a non-luminescent region;
an oxide thin film transistor (TFT) on the substrate in the non-luminescent region and including an oxide semiconductor layer, a gate insulation film, a gate electrode, a source electrode and a drain electrode;
an organic light emitting element on the substrate in the luminescent region and including a first electrode, an organic light emitting layer and a second electrode; and
a protective film covering the oxide TFT and over the substrate, the protective film configured to expose a partial region of the first electrode without having a bank layer formed on the protective film,
wherein the first electrode is on the same layer as that of the oxide semiconductor layer, is spaced apart from the oxide semiconductor layer, and is only in the luminescent region.

10. The organic light emitting diode display device of claim 9, further comprising an interlayer insulation film on the substrate and configured to expose a partial region of the first electrode in the luminescent region.

11. The organic light emitting diode display device of claim 9, wherein the first electrode and the oxide semiconductor layer are the same material comprised of one among indium gallium zinc oxide (IGZO), indium tin zinc oxide (ITZO), and indium aluminum zinc oxide (IAZO).

12. The organic light emitting diode display device of claim 9, wherein the first electrode has the work function of 5.63 eV, the work function configured to effectively inject holes into the organic light emitting layer without having a hole injection layer and a hole transport layer disposed between the first electrode and the organic light emitting layer.

13. The organic light emitting display device according to claim 9, further comprising a reflective layer under the first electrode so as to shield external light.

14. An apparatus comprising:
a co-planar thin film transistor (TFT) on a substrate, the co-planar TFT having an active layer of oxide material that is selectively doped to have a source region and a drain region; and
a pixel electrode spaced apart from and on equal plane with the active layer, the pixel electrode made from the same oxide material as the active layer,
the co-planar TFT having a source electrode and a drain electrode situated above and respectively connected to the source region and to the drain region, with either the source electrode or the drain electrode configured to contact the pixel electrode without use of a contact hole or via.

15. The apparatus of claim 14, wherein a layer of the oxide material for the active layer and for the pixel electrode results from a simultaneous formation procedure employing the same mask.

16. The apparatus of claim 15, further comprising:
a protective film covering the co-planar TFT and the pixel electrode with a portion of the pixel electrode exposed therefrom, which foregoes the need of a bank layer.

17. The apparatus of claim 16, further comprising:
a light shield layer under at least one of the active layer and the pixel electrode.

18. A thin film transistor comprising:
a first oxide layer having source and drain regions as a result of selective doping and an active region between the source and drain regions;
a gate over the active region of the first oxide layer;
an interlayer insulation film, over the gate and the first oxide layer, with contact holes that selectively reveal portions of the source and drain regions; and
source and drain electrodes in respective contact with the source and drain regions via the contact holes to achieve a co-planar configuration of the thin film transistor,
one of the source and drain electrodes extending completely over one outer edge of the interlayer insulation film to contact with a second oxide layer at a distance from and on a same planar relationship with the first oxide layer.

19. The thin film transistor of claim 18, wherein the first and second oxide layers are the same material and formed simultaneously using a single mask, and wherein the second oxide layer acts as a pixel electrode as a result of annealing.

20. The thin film transistor of claim 19, further comprising a light shield layer under the first oxide layer.

* * * * *